United States Patent
Furutani et al.

(10) Patent No.: US 10,231,336 B2
(45) Date of Patent: Mar. 12, 2019

(54) PRINTED WIRING BOARD FOR MOUNTING ELECTRONIC COMPONENT

(71) Applicant: IBIDEN CO., LTD., Ogaki (JP)

(72) Inventors: Toshiki Furutani, Ogaki (JP); Takema Adachi, Ogaki (JP); Toshihide Makino, Ogaki (JP); Hidetoshi Noguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/920,594

(22) Filed: Mar. 14, 2018

(65) Prior Publication Data

US 2018/0270951 A1 Sep. 20, 2018

(30) Foreign Application Priority Data

Mar. 14, 2017 (JP) .................. 2017-048884

(51) Int. Cl.

| | |
|---|---|
| H05K 1/11 | (2006.01) |
| H05K 3/42 | (2006.01) |
| H05K 3/46 | (2006.01) |
| H05K 3/18 | (2006.01) |
| H05K 3/06 | (2006.01) |
| H05K 3/24 | (2006.01) |

(Continued)

(52) U.S. Cl.
CPC ........... H05K 1/113 (2013.01); H05K 1/0206 (2013.01); H05K 3/061 (2013.01); H05K 3/18 (2013.01); H05K 3/24 (2013.01); H05K 3/424 (2013.01); H05K 3/429 (2013.01); H05K 3/4682 (2013.01); H05K 1/0373 (2013.01); H05K 3/14 (2013.01); H05K 2201/09827 (2013.01); H05K 2203/0152 (2013.01); H05K 2203/0278 (2013.01); H05K 2203/0307 (2013.01); H05K 2203/0723 (2013.01); H05K 2203/107 (2013.01)

(58) Field of Classification Search
CPC ...... H05K 1/113; H05K 1/0206; H05K 3/061; H05K 3/18; H05K 3/24
USPC ........................................ 174/262
See application file for complete search history.

(56) References Cited

U.S. PATENT DOCUMENTS

2015/0016079 A1* 1/2015 Furutani ............... H05K 1/185
361/763

FOREIGN PATENT DOCUMENTS

JP 2011-138838 A 7/2011

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes a first conductor layer forming an inner conductor layer, a second conductor layer forming a first outermost conductor layer, a third conductor layer forming a second outermost conductor layer, insulating layers including first and second insulating layers, first via conductors connecting the first and second conductor layers, and second via conductors connecting the first and third conductor layers. The first conductor layer has thickness greater than thicknesses of the second and third conductor layers, the second conductor layer includes component mounting pads positioned to mount an electronic component on the second conductor layer and extending outside component mounting region corresponding to projection region of the component, and the first via conductors include a first set of the first via conductors formed directly underneath the component mounting region and a second set of the first via conductors formed on outer side of the component mounting region.

20 Claims, 10 Drawing Sheets

(51) Int. Cl.
  *H05K 1/02*   (2006.01)
  *H05K 1/03*   (2006.01)
  *H05K 3/14*   (2006.01)

PRINTED WIRING BOARD FOR MOUNTING ELECTRONIC COMPONENT

CROSS-REFERENCE TO RELATED APPLICATIONS

The present application is based upon and claims the benefit of priority to Japanese Patent Application No. 2017-048884, filed Mar. 14, 2017, the entire contents of which are incorporated herein by reference.

BACKGROUND OF THE INVENTION

Field of the Invention

The present invention relates to a printed wiring board.

Description of Background Art

Japanese Patent Laid-Open Publication No. 2011-138838 describes a circuit substrate that includes a substrate, a frame and a circuit board, which are sequentially laminated, and a conductive member accommodated in the frame. The entire contents of this publication are incorporated herein by reference.

SUMMARY OF THE INVENTION

According to one aspect of the present invention, a printed wiring board includes a first conductor layer forming an inner conductor layer, a second conductor layer forming a first outermost conductor layer on a first side of the first conductor layer, a third conductor layer forming a second outermost conductor layer on a second side of the first conductor layer on the opposite side with respect to the first side of the first conductor layer, insulating layers including a first insulating layer formed between the first conductor layer and the second conductor layer and a second insulating layer formed between the first conductor layer and the third conductor layer, first via conductors formed in the first insulating layer such that the first via conductors are connecting the first conductor layer and the second conductor layer, and second via conductors formed in the second insulating layer such that the second via conductors are connecting the first conductor layer and the third conductor layer. The first conductor layer is formed such that the first conductor layer has a thickness that is greater than a thickness of the second conductor layer and greater than a thickness of the third conductor layer, the second conductor layer includes component mounting pads positioned to mount an electronic component on the second conductor layer and formed such that the component mounting pads are extending outside a component mounting region corresponding to a projection region of the electronic component, and the first via conductors include a first set of the first via conductors formed directly underneath the component mounting region and a second set of the first via conductors formed on an outer side of the component mounting region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5Ba is an enlarged view exaggeratedly illustrating unevenness of a VBa portion of FIG. 5B;

FIG. 5Da is an enlarged view exaggeratedly illustrating unevenness of a VDa portion of FIG. 5D;

FIG. 5Ea is an enlarged view exaggeratedly illustrating unevenness of a VEa portion of FIG. 5E;

FIG. 5Fa is an enlarged view exaggeratedly illustrating unevenness of a VFa portion of FIG. 5F;

FIG. 5Ga is an enlarged view exaggeratedly illustrating unevenness of a VGa portion of FIG. 5G;

DETAILED DESCRIPTION OF THE EMBODIMENTS

Figure 1:
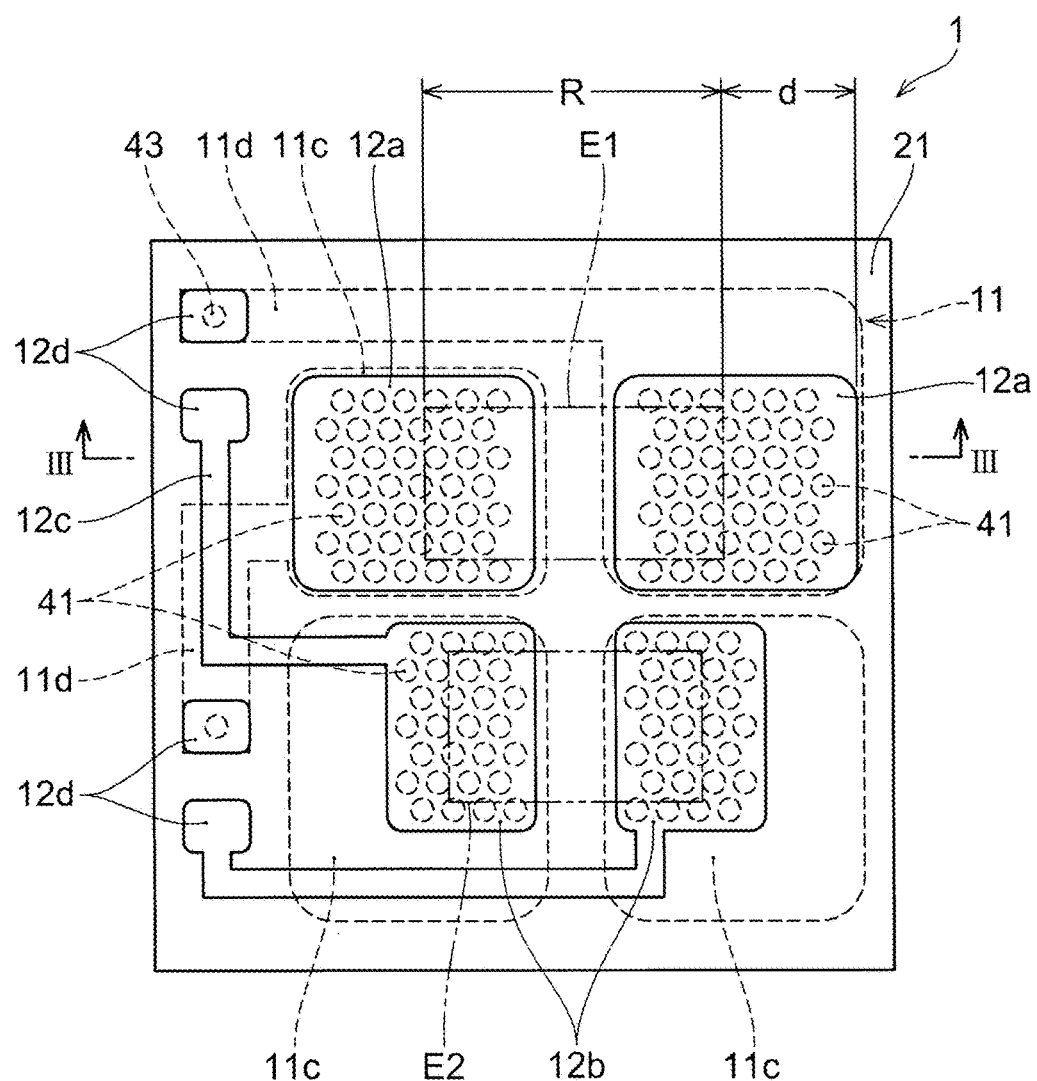
FIG. 1 is a plan view illustrating a surface on one side of a printed wiring board of an embodiment of the present invention.

Embodiments will now be described with reference to the accompanying drawings, wherein like reference numerals designate corresponding or identical elements throughout the various drawings.

Figure 2:
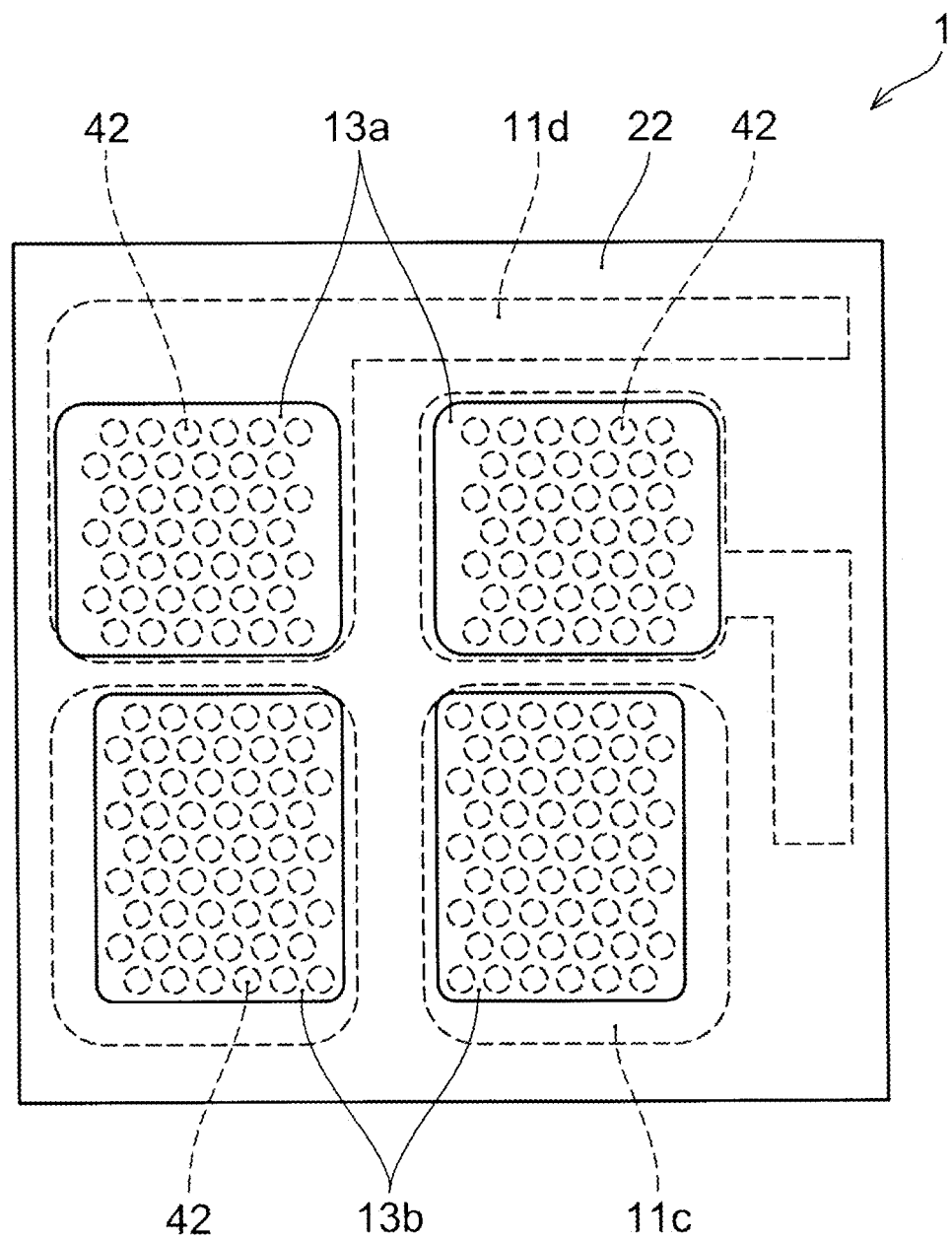
FIG. 2 illustrates a conductor pattern of a surface on the other side of the printed wiring board of FIG. 1.
Figure 3:
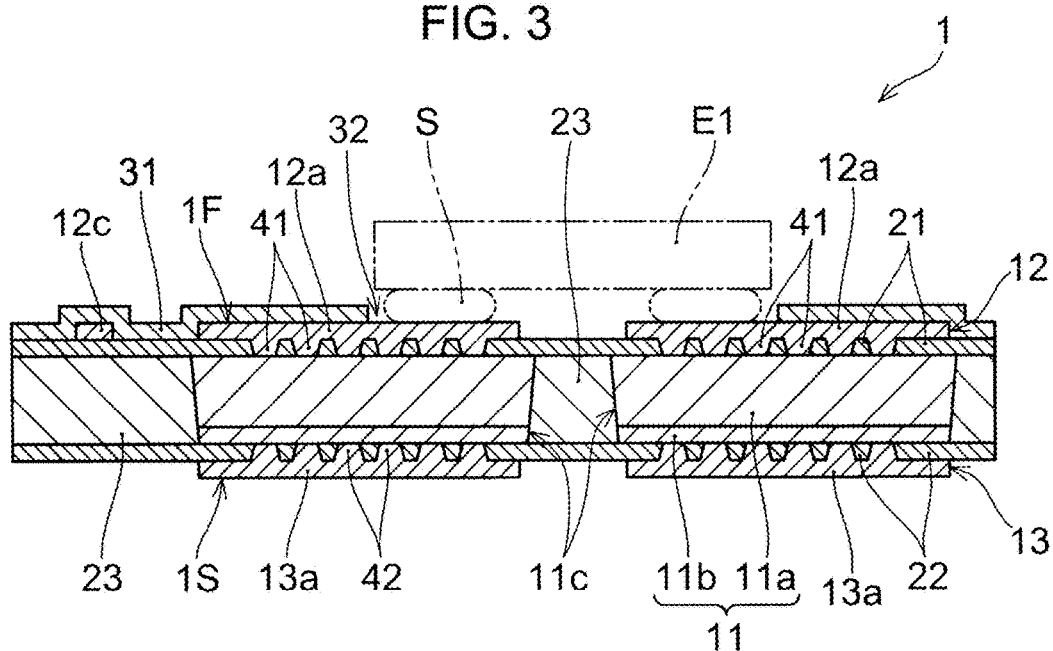
FIG. 3 is a cross-sectional view along a III-III line of the printed wiring board of FIG. 1.

A printed wiring board according to an embodiment of the present invention is described with reference to the drawings. FIG. 1-3 illustrate a printed wiring board 1 of an embodiment. The printed wiring board 1 includes: a first conductor layer 11 as an inner layer; a second conductor layer 12 and a third conductor layer 13 that are respectively formed on outermost layers on both sides (including one surface and the other surface on an opposite side of the one surface) of the first conductor layer 11; at least one first insulating layer 21 and at least one second insulating layer 22 that are respectively provided between the first conductor layer 11 and the second conductor layer 12 and between the first conductor layer 11 and the third conductor layer 13; multiple first via conductors 41 that are formed in the first insulating layer 21 and connect the first conductor layer 11 and the second conductor layer 12; and multiple second via conductors 42 that are formed in the second insulating layer 22 and connect the first conductor layer 11 and the third conductor layer 13. The first conductor layer 11 is formed thicker than the second conductor layer 12 and the third conductor layer 13. In the second conductor layer 12, component mounting pads (12a) are formed each extending to an outer side of a component (E) more than a component mounting region (R) does. In the third conductor layer 13, connection conductor pads (13a) are formed. Some of the multiple first via conductors 41 are formed directly below the component mounting region (R) and the other multiple first via conductors 41 are formed outside the component mounting region (R). As illustrated in FIG. 1-3, in the printed wiring board 1 of the embodiment, the first conductor layer 11 as an inner layer is formed much thicker than the second conductor layer 12 and the third conductor layer 13. It is thought that this improves heat dissipation. In addition, as illustrated by examples of wirings (11d) indicated by dashed lines in FIG. 1, wiring patterns are formed in the first conductor layer 11. Therefore, the first conductor layer 11 is not embedded merely for heat dissipation, but is formed as a part of a circuit. The first conductor layer 11 is preferably formed of copper having excellent heat conduction and electrical conduction. However, without being limited to this, the first conductor layer 11 may also be formed of other metals such as nickel. Even for such a thick conductor layer, by using a metal foil or a metal plate, a required thickness can be easily ensured. When a metal foil having a desired thickness is not available, it is possible that the first conductor layer 11 is formed of a metal foil (11a) having a thickness smaller than a desired thickness and a conductor coating (11b) coating-formed on the metal foil (11a) by plating, vacuum deposition, sputtering or the like. In this case, a mat surface (uneven surface), which is a surface of the metal foil (11a), is preferably on the second conductor layer 12 side. It is thought that adhesion between the first insulating layer 21 sandwiched therebetween and the first conductor layer 11 is improved. Further, the other surface of the metal foil (11a) is usually a flat surface. However, for example, by subjecting the conductor coating (11b), which is fowled by electrolytic plating or the like, to a roughening treatment, the surface becomes a roughened surface and it is thought that adhesion with the second insulating layer 22 on the other surface side is also improved.

As illustrated in FIG. 1-3, the second conductor layer 12 and the third conductor layer 13 are respectively provided on the outermost layers on both sides of the first conductor layer 11. In the second conductor layer 12, a pair of the component mounting pads (12a) is formed. The component mounting pads (12a) have a pair of conductor pads that are to be respectively connected to different electrodes of an electronic component (E1) to be mounted. In the example illustrated in FIG. 1, second component mounting pads (12b) are formed side by side in the second conductor layer 12. However, functionally, the second component mounting pads (12b) are the same as the component mounting pads (12a) and thus a description thereof is omitted. A pair of the component mounting pads (12a) are formed, and the external electronic component (E1) is mounted using a flip chip method or the like using a bonding material such as solder (see FIG. 3). Further, as illustrated in FIG. 2, in the third conductor layer 13, the connection conductor pads (13a) and second connection conductor pads (13b) are foimed. The connection conductor pads (13a) have a pair of conductor pads that are to be respectively connected to different electrodes of an electronic component (not illustrated in the drawings) to be connected to the connection conductor pads (13a). The connection conductor pads (13a) are formed at positions overlapping with the component mounting pads (12a) in a plan view, and the second connection conductor pads (13b) are formed at positions overlapping with the second component mounting pads (12b) in a plan view. The connection conductor pads (13a) are the like are connected to, for example, external elements (not illustrated in the drawings) such as a motherboard. That is, in the printed wiring board 1, a first surface (1F) is a component mounting surface, and a second surface (1S) side is, for example, a surface for connecting to external elements such as a motherboard. Further, on the first surface (1F) of the printed wiring board 1, a solder resist layer 31 (see FIG. 3) having an opening 32 at an appropriate position is formed. Further, although not illustrated, a solder resist layer may also be formed on the second surface (1S).

As illustrated in FIGS. 1 and 3, the component mounting pads (12a) are foimed each extending to an outer side of the electronic component (E1) far more than the component mounting region (R) of the electronic component (E1) (corresponding to a projection region of the electronic component (E1) to the second conductor layer 12 in a region where the electronic component (E1) is mounted) does. A distance (d) (see FIG. 1) between an edge of the electronic component (E1) and an edge of a component mounting pad (12a) is preferably 200 µm or more and 500 µm or less. The distance (d) is more preferably 300 µm or more and 400 µm or less. Heat is easily dissipated. In addition, it is possible to increase the number of the first via conductors 41 (to be described later), and it is thought that heat conduction to the first conductor layer 11 side is improved. Since the temperature on the connection conductor pads (13a) side of the first conductor layer 11 is lowered relative to that on the component mounting pads (12a) side, necessity for heat dissipation decreases. However, the connection conductor pads (13a) are also similarly formed each extending to an outer side of the electronic component (E1) far more than a projection region of the component mounting region (R) of the electronic component (E1) to the third conductor layer 13 does. A purpose of this is similar to that of the component mounting pads (12a), and an amount of the extension to the outer side is also about the same as the distance (d) of the component mounting pads (12a). By doing so, heat is easily dissipated by increasing the number of the second via conductors 42.

As described above, the printed wiring board 1 includes the first insulating layer 21 between the first conductor layer 11 and the second conductor layer 12 and the second insulating layer 22 between the first conductor layer 11 and the third conductor layer 13. The first insulating layer 21 and the second insulating layer 22 are not each limited to one insulating layer, but may each be an insulating layer that includes multiple insulating layers laminated via conductor layers. An insulating material that forms the first and second insulating layers (21, 22) may be, for example, an epoxy resin formed into a film-like shape, or a prepreg formed by impregnating a reinforcing material such as a glass fiber with an epoxy resin.

Further, the densely formed multiple first via conductors 41 and multiple second via conductors 42 are respectively fowled in the first and second insulating layers (21, 22). The first via conductors 41 connect the first conductor layer 11 and the second conductor layer 12. The second via conductors 42 connect the first conductor layer 11 and the third conductor layer 13. The first and second via conductors (41, 42) function as so-called thermal vias that thermally connect between the first-third conductor layers (11, 12, 13) with a high thermal conductivity. Therefore, the first and second via conductors (41, 42) preferably at least have good conductivity with respect to heat. On the other hand, the first and second via conductors (41, 42) also electrically connect between the first-third conductor layers (11, 12, 13) and thus are preferable also electrically good conductors.

The first via conductors 41 are also foamed in a portion where the component mounting pads (12a) are farmed extending to the outer side of the component mounting region (R) of the electronic component (E1). The via conductors 41 in this portion may be formed with the same size and interval as the via conductors 41 formed in the component mounting region (R). As a result, heat spreading outward by the component mounting pads (12a) is not only dissipated by radiation from the surface but is also efficiently dissipated by conduction to the first conductor layer 11 via the first via conductors 41. As described above, the connection conductor pads (13a) are also formed extending to an outer side of the projection region of the component mounting region (R). And multiple second via conductors 42 are also formed in the portion where the connection conductor pads (13a) are formed extending to an outer side of the projection region of the component mounting region (R). As a result, heat conducted to the first conductor layer 11 is easily conducted to the connection conductor pads (13a) via the second via conductors 42 formed in the portion where the connection conductor pads (13a) are formed extending to an outer side of the projection region of the component mounting region (R). Then, heat conducted to the connection conductor pads (13a) is dissipated by radiation from the connection conductor pads (13a) and by conduction to a motherboard (not illustrated in the drawings) or the like connected to the connection conductor pads (13a).

The multiple first via conductors 41 connect between the component mounting pads (12a) and the first conductor layer 11, which is an inner-layer conductor layer, and the multiple second via conductors 42 connect between the connection conductor pads (13a) and the first conductor layer 11. In this way, in the present embodiment, the component mounting pads (12a) and the thick inner-layer first conductor layer 11 are connected by the first via conductors 41 having the function of themial vias, and the first conductor layer 11 and the connection conductor pads (13a) are also connected by the second via conductors 42 having the function of thermal vias. As will be described later, the via conductors (41, 42) functioning as thermal vias can be formed of a metal such as copper having a high thermal conductivity. Therefore, it is thought that heat can efficiently conducted from the component mounting pads (12a) on the first surface (1F) side via the first and second via conductors (41, 42) and the first conductor layer 11 to a motherboard (not illustrated in the drawings) or the like.

As described above, the multiple via conductors (41, 42) that are respectively fixated with respect to the component mounting pads (12a) and the connection conductor pads (13a) can function as thermal vias. Regarding contact areas with the second conductor layer 12 and the third conductor layer 13, the first and second via conductors (41, 42) are each formed, for example, having an area of 2,000 µm$^2$ or more and 70,680 µm$^2$ or less, and are preferably each fanned having an area of 17,600 µm$^2$ or more. Further, a ratio of an area occupied by the multiple first via conductors 41 with respect to the component mounting pads (12a) ((total contact area between the component mounting pads (12a) and the first via conductors 41)/(area of the component mounting pads (12a))×100) is preferably 15% or more and 40% or less. Similarly, a ratio of an area occupied by the second via conductors 42 with respect to the connection conductor pads (13a) is also preferably 15% or more and 40% or less. It is thought that the component mounting pads (12a) and the connection conductor pads (13a) are connected to the first conductor layer 11 with sufficiently low thermal resistance, and mechanical strength of the first and second insulating layers (21, 22) is also maintained at a certain level or higher.

The electronic component (E1) to be mounted on the component mounting pads (12a) is, for example, an active component such as a semiconductor device, or a passive component such as an inductor. However, the electronic component (E1) is not limited to these. It is thought that the printed wiring board of the embodiment capable of having high heat dissipation performance is particularly suitable for mounting an electronic component that generates heat during operation, for example, a power-based semiconductor, a power-based resistor, a light emitting diode, or the like.

The component mounting pads (12a) are component mounting pads including a pair of conductor pads. Further, the connection conductor pads (13a) are a pair of conductor pads provided corresponding to the component mounting pads (12a). In the printed wiring board 1, as described above, the multiple first via conductors 41 are provided substantially over the entire surface of the component mounting pads (12a) that are each foamed large extending to an outer side of the component mounting region (R). The multiple first via conductors 41 are arranged at substantially the same arrangement pitch. Since the size of each of the connection conductor pads (13a) in a plan view is substantially the same as the size of each of the component mounting pads (12a) in a plan view, the number of the first via conductors 41 is substantially the same as the number of the second via conductors 42.

In the example of FIGS. 1 and 2, the multiple first via conductors 41 and the multiple second via conductors 42 are arranged in a so-called staggered arrangement in which each row of via conductors is shifted by a half pitch with respect to a neighboring row of via conductors. It is thought that the multiple via conductors (41, 42) can be arranged at a higher density under constraints from a design side and a manufacturing side with respect to intervals between adjacent via conductors. However, the arrangement of the multiple via conductors is not limited to the staggered arrangement. For example, it is also possible that the multiple via conductors are arranged in a lattice pattern (matrix pattern), or are completely randomly arranged. It is also possible that via conductors each having a circular cross section and a large cross-sectional area are arranged in a matrix pattern, and, between each two rows of the large via conductors, via conductors each having a small cross-sectional area are each arranged at a center region of four adjacent large via conductors. By doing so, it is possible to obtain via conductors (41, 42) having a wide cross-sectional area as a whole.

Further, the printed wiring board 1 is an example in which a pair of the connection conductor pads (13a) is formed corresponding to a pair of the component mounting pads (12a). However, it is also possible that two or more component mounting pads (12a) are formed overlapping with one connection conductor pad (13a) on the second surface (1S) side. Further, it is also possible that multiple connection conductor pads (13a) are formed corresponding to one component mounting pad (12a). When multiple component mounting pads (12a) are formed, it is preferable that at least one of the component mounting pads (12a) is formed extending to an outer side of the electronic component (E1) far more than the component mounting region (R) does, and first via conductors 41 are also formed on an outer side of the component mounting region (R). Further, when multiple connection conductor pads (13a) are formed, preferably, at least one of the connection conductor pads (13a) is formed extending to an outer side of the electronic component (E1) far more than a projection position of the component mounting region (R) does, and second via conductors 42 are preferably also formed in the region extending to the outer side.

The second and third conductor layers (12, 13) including the component mounting pads (12a) or the connection conductor pads (13a) are each formed of, for example, a metal foil and a plating film or the like (in FIG. 3, the second and third conductor layers (12, 13) are each illustrated simplified as having a one-layer structure). Examples of materials of the second and third conductor layers (12, 13) include copper, nickel and the like. However, the materials of the second and third conductor layers (12, 13) are not limited to these materials. As will be described later, the second and third conductor layers (12, 13) can each be formed to have any conductor pattern using a subtractive method or an additive method. In the example of FIG. 1, in addition to the component mounting pads (12a, 12b), the second conductor layer 12 includes two third component mounting pads (12d), which are formed from a pair of conductor pads, and wiring patterns (12c) connecting between the third component mounting pads (12d) and the second component mounting pads (12b).

The first conductor layer 11 of the printed wiring board 1 includes predetermined conductor patterns. As illustrated in FIGS. 1 and 3, in the first conductor layer 11, inner-layer conductor pads (11c) formed between the component mounting pads (12a) and the connection conductor pads (13a), and inner-layer wiring patterns (11d) connecting to the third component mounting pads (12d) are formed. As illustrated in FIG. 1, the inner-layer wiring patterns (11d) are connected to the third component mounting pads (12d) of the second conductor layer 12 via third via conductors 43 at front ends of the inner-layer wiring patterns (11d). That is, as described above, the first conductor layer 11, which contributes to realization of high heat dissipation performance as a good thermal conductor and a thermal diffuser in the heat dissipation structure of the printed wiring board 1, is also used in forming a predetermined electrical circuit in the printed wiring board 1. As described below in a manufacturing method, the first conductor layer 11 of the present embodiment can be easily patterned, for example, by etching. That is, the first conductor layer 11 can basically have any conductor pattern. When a desired electrical circuit cannot be structured using only the second and third conductor layers (12, 13), the desired electrical circuit can be formed without adding an additional conductor layer.

The thickness of the first conductor layer 11 is, for example, 100 μm or more and 2000 μm or less, and preferably 200 μm or more and 300 μm or less. The reason is that, when the first conductor layer 11 is too thin, a theimal diffusion effect in a planar direction cannot be sufficiently obtained, and, conversely, when the first conductor layer 11 is too thick, thermal resistance in a thickness direction is excessively increased. However, the thickness of the first conductor layer 11 is not limited to these. As illustrated in FIG. 3, when the first conductor layer 11 has a two-layer structure, preferably, the metal foil (11a) has a thickness occupying 90% or more of the thickness of the first conductor layer 11. The thickness of the conductor coating (11b) can be reduced, and formation time of the conductor coating (11b) can be shortened.

In the example of FIG. 3, the first conductor layer 11 having a two-layer structure is provided such that the metal foil (11a) side is on the component mounting pads (12a) side. A metal foil for the printed wiring board can have a mat surface having a large surface roughness on one side. By orienting the mat surface toward the component mounting pads (12a) side, a contact area between the first conductor layer 11 and the first insulating layer 21 or the first via conductors 41 is increased by the unevenness of the mat surface having a large surface roughness. The first conductor layer 11 strongly adheres to elements on the first surface (1F) side. Due to heat generated by the electronic component (E1) or the like mounted on the component mounting pads (12a), the temperature on the first surface (1F) side may be higher than the temperature on the second surface (1S) side. It is thought that, by arranging the metal foil (11a) on the component mounting pads (12a) side, peeling due to a difference in thermal expansion coefficient between an element on the first surface (1F) side that tends to be exposed to a larger temperature rise and the first conductor layer 11 is prevented.

As described above, the first conductor layer 11 includes the inner-layer conductor pads (11c) formed between the component mounting pads (12a) and the connection conductor pads (13a), and conductor patterns such as the inner-layer wiring patterns (11d). As illustrated in FIG. 3, side surfaces of the conductor patterns of the first conductor layer 11 are inclined such that sizes of the conductor patterns in a plan view increase from the connection conductor pads (13a) side (second surface (1S) side) toward the component mounting pads (12a) side (first surface (1F) side). It is thought that the contact area between the first conductor layer 11 and the first insulating layer 21 is larger than the contact area between the first conductor layer 11 and the second insulating layer 22. As described above, it is thought that peeling due to a difference in thermal expansion coefficient between the first insulating layer 21 on the first surface (1F) side that tends to be exposed to a larger temperature rise and the first conductor layer 11 is further prevented.

As illustrated in FIG. 3, an intralayer insulator 23 is formed by filling a space between the conductor patterns of the first conductor layer 11 with an insulating material. Due to the intralayer insulator 23, the conductor patterns of the first conductor layer 11 are reliably insulated from each other. Two surfaces of the first conductor layer 11 in the thickness direction are respectively substantially flush with two surfaces of the intralayer insulator 23. Due to the intralayer insulator 23, interfaces between the first conductor layer 11 and the first and second insulating layers (21, 22) can be substantially entirely flat. It is thought that the conductor patterns of the second and third conductor layers (12, 13) can be formed on flat surfaces of the first and second insulating layers (21, 22). The intralayer insulator 23 is formed of, for example, an epoxy resin or the like. However, the material of the intralayer insulator 23 is not limited to an epoxy resin, and any insulating material other than an epoxy resin can be used for forming the intralayer insulator 23.

The first and second insulating layers (21, 22) are formed of, for example, any insulating material composed of a resin. Preferably, the first and second insulating layers (21, 22) are each formed of an epoxy resin containing a reinforcing material such as a glass fiber as in the case of a prepregor, or not containing a reinforcing material such as a glass fiber. A bismaleimide triazine resin (BT resin), a phenolic resin and the like may be used as the material of the first and second insulating layers (21, 22). A resin that forms the insulating layers may contain inorganic filler such as silica. A thickness of each of the first and second insulating layer (21, 22) is, for example, 10 μm or more and 100 μm or less, and is preferably 30 μm.

The first-third via conductors (41-43) are fanned in via holes provided in the first insulating layer 21 or the second insulating layer 22. The first and second via conductors (41, 42) are each formed of a material having a high thermal conductivity such as a metal, and are preferably each formed of a conductive material. Further, the via conductors (41-43) are preferably formed of the same material as the second conductor layer 12 and the third conductor layer 13. An example of a preferable material of the via conductors (41-43) is a copper plating film. The via conductors are preferably formed of material having a theiinal conductivity of at least 60 W/(m·K) or more, and more preferably 350 W/(m·K) or more. The third via conductors 43 are preferably good conductors for electrical conduction rather than for thermal conduction. The third via conductors 43 are formed of a copper plating film or the like. The via conductors (41-43) each have a tapered shape that tapers toward the first conductor layer 11 side. The sizes of the via conductors (41-43) can be arbitrarily selected according to the thicknesses of the first and second insulating layers (21, 22), the arrangement pitches of the via conductors, and the like. For example, in a case of via conductors each having a substantially circular planar shape, a diameter of each of the via conductors (41-43) at an interface with the first conductor layer 11 is 30 μm or more and 300 μm or less. Preferably, the diameter of each of the via conductors (41-43) at the interface with the first conductor layer 11 is 150 μm or more. It is thought that, even with the first and second via conductors (41, 42) functioning as thermal vias, a sufficient thermal conductivity can be obtained.

As described above, the above-described "component mounting region (R)" is a region that is in the component mounting pads (12a) and on which an electronic component is actually placed. That is, when the electronic component (E1) is arranged on the component mounting pads (12a), a projection region when the electronic component (E1) is actually placed is the component mounting region (R) (having an area substantially the same as the electronic component (E1)). Therefore, the "component mounting region (R)" does not need to be clearly defined in the component mounting pads (12a) before the electronic component (E1) is arranged. However, as in the example illustrated in FIG. 4A and 4B, the component mounting region (R) may be approximated by some structural element in the component mounting pads (12a).

Figure 4A:
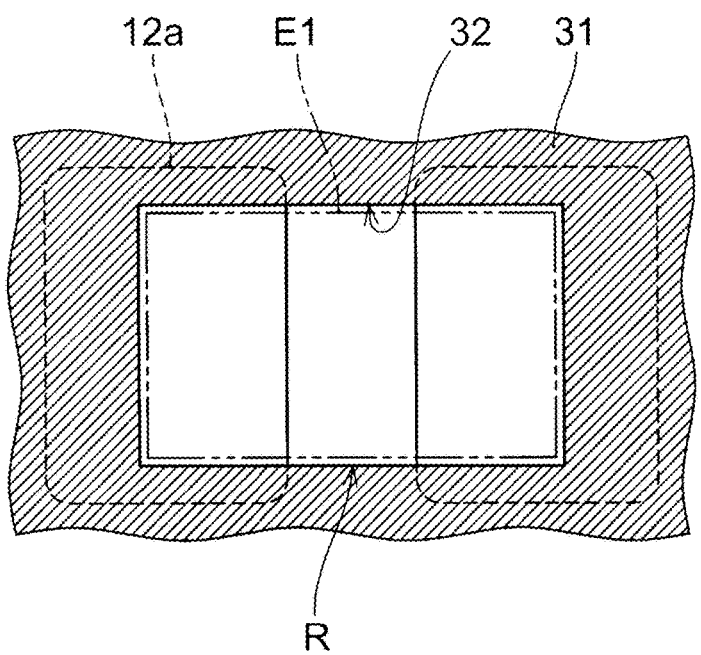
FIG. 4A illustrates an example of a component mounting region of a printed wiring board of an embodiment.

In the example of FIG. 4A, the component mounting region (R) can be approximated by the opening 32 provided in the solder resist layer 31. The solder resist layer 31 is formed by opening only a portion for soldering the electronic component (E1) in the component mounting pads (12a). Therefore, the component mounting region (R) can also change depending on positions of terminals or the like of the electronic component (E1). However, when the terminals are formed near an outer periphery of the electronic component (E1), the component mounting region (R) substantially matches an outer shape of the electronic component (E1). When the terminals or the like are formed on a center side of the electronic component (E1), the component mounting region (R) may not match the opening 32 of the solder resist layer 31. However, it is also possible to regard a region where the solder resist layer 31 is not formed as the component mounting region (R). In the component mounting pads (12a), temperatures at portions connecting to the terminals of the electronic component (E1) are the highest, and forming the first via conductors 41 directly below such portions is preferable from a point of view of heat conduction. However, in the present embodiment, the first via conductors 41 are formed not only directly below those portions but are also formed on outer side of the electronic component (E1) relative to those portions, that is, below the solder resist layer 31.

Figure 4B:
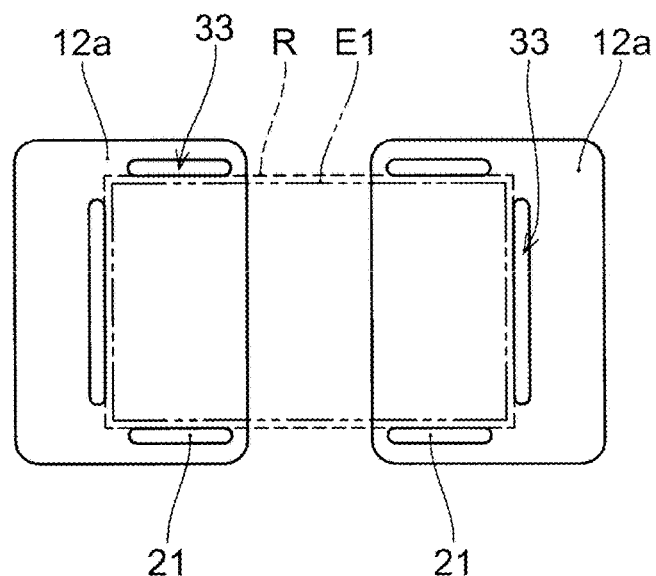
FIG. 4B illustrates another example of a component mounting region of the printed wiring board of the embodiment.

In the example of FIG. 4B, for the component mounting region (R), an approximate region of the component mounting region (R) is indicated by slit-like openings 33 provided in the component mounting pads (12a). Three slit-like openings 33 are formed for each of the pair of the conductor pads of the component mounting pads (12a) (the first insulating layer 21 is exposed in the openings 33). For example, a region surrounded by inner peripheries of the six openings 33 can approximate the component mounting region (R). It is also possible that the openings 33 are not each a single slit-like opening as in the example of FIG. 4B, and multiple openings may be continuously formed like perforations.

As described above, the printed wiring board of the embodiment may have two or more insulating layers and conductor layers on each of both sides of the thick inner-layer first conductor layer 11. The via conductors are formed in the insulating layers. The thick inner-layer first conductor layer 11 is connected to the component mounting pads (12a) formed on the second conductor layer 12, which is an outermost layer on one side, and the connection conductor pads (13a) formed on the third conductor layer 13, which is an outermost layer on the other side, by the via conductors that are respectively formed in the multiple insulating layers. Also in this case, the first and second via conductors 41, 42 that connect the component mounting pads (12a) and the connection conductor pads (13a) to the thick inner-layer first conductor layer 11 are also formed on an outer side of the component mounting region (R).

An example of a method for manufacturing a printed wiring board of an embodiment is described below with reference to FIG. 5A-5J using the printed wiring board 1 illustrated in FIG. 1 as an example. FIG. 5A-5J illustrate cross sections corresponding to FIG. 3.

Figure 5A:
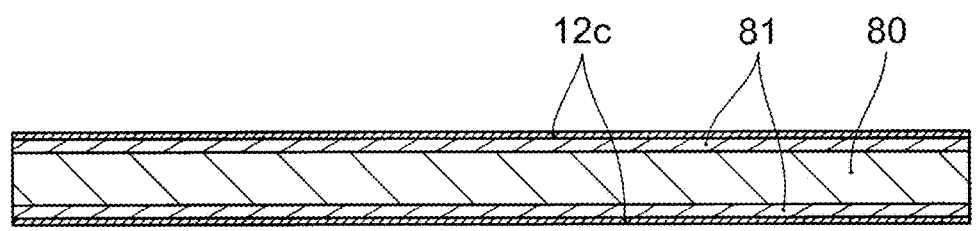
FIG. 5A illustrates a method for manufacturing a printed wiring board according to an embodiment of the present invention.

As illustrated in FIG. 5A, a support plate 80 is prepared, a metal foil (12c) being provided on each surface of the support plate 80. The metal foil (12c) forms a portion of the second conductor layer 12 (see FIG. 3), when the printed wiring board 1 is completed. The metal foil (12c) has a carrier metal foil 81 adhered to one side of the metal foil (12c). A surface of the carrier metal foil 81 on an opposite side of the metal foil (12c) is bonded to a surface of the support plate 80 by thermocompression bonding or the like. The metal foil (12c) and the carrier metal foil 81 are adhered to each other by, for example, a separable adhesive such as a thermoplastic adhesive. It is also possible that the metal foil (12c) and the carrier metal foil 81 are adhered to each other only in a margin portion near an outer periphery. For example, a prepreg obtained by impregnating a core material such as a glass fiber with a resin material such as an epoxy resin is used for the support plate 80. The prepreg can be fully cured when being thermocompression-bonded to the carrier metal foil 81. It is also possible that a metal plate such as a copper plate is used for the support plate 80. Further, it is also possible that a double-sided copper-clad laminated plate is used as the support plate 80 having the carrier metal foil 81. The metal foil (12*c*) and the carrier metal foil 81 are preferably copper foils. Other metal foils such as a nickel foil may also be used. The metal foil (12*c*) has a thickness of, for example, 3 μm or more and 10 μm or less. In FIG. 5A-5J, it is not intended to illustrate exact ratios of thicknesses of the structural elements.

In the example of FIG. 5A, the metal foil (12*c*) is provided on both front and back surfaces of the support plate 80. Printed wiring boards 1 can be formed at the same time on both sides of the support plate 80. The printed wiring boards 1 can be efficiently manufactured. However, the metal foil (12*c*) is not necessarily required to be provided on both front and back sides of the support plate 80. In FIG. 5B-5G and the following description, on each drawing, regarding the printed wiring board formed on the upper side of the support plate 80, a reference numeral symbol of a structural element is indicated only in a drawing illustrating a formation process of the structural element, and the reference numeral symbol of the structural element in a drawing illustrating a subsequent process and description thereof are omitted as appropriate. Further, in FIG. 5B-5G, only one printed wiring board 1 during manufacture is illustrated on each side of the support plate 80. However, it is also possible that, on each side of the support plate 80, multiple printed boards 1 are formed at the same time in a side-by-side state.

Figure 5B:
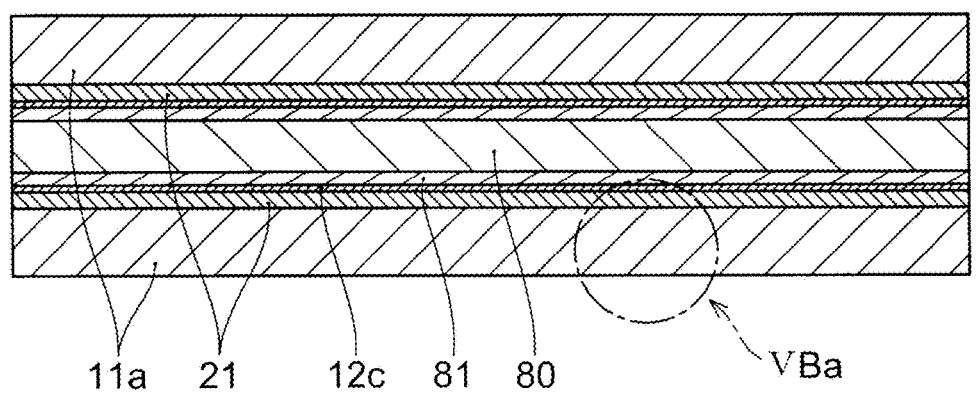
FIG. 5B illustrates a method for manufacturing a printed wiring board according to an embodiment of the present invention.
Figure 5B:
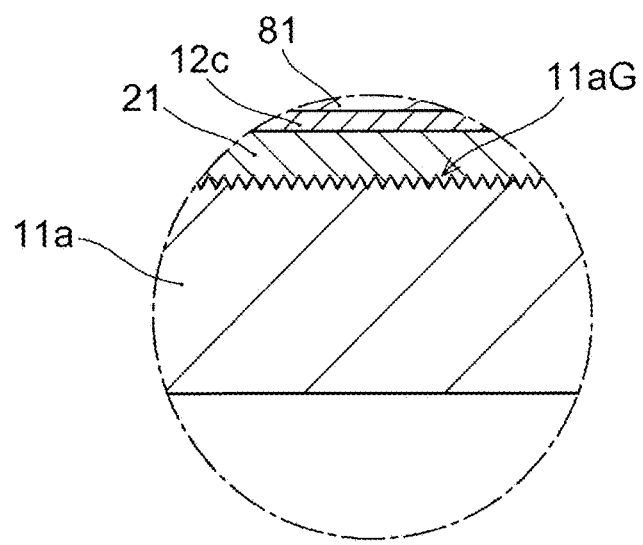

As illustrated in FIG. 5B, an insulating material that forms the first insulating layer 21 is laminated on a surface of the metal foil (12*c*). Further, a thick metal foil (11*a*) that forms the first conductor layer 11 (see FIG. 3) is laminated on the insulating material. By applying pressure from the metal foil (11*a*) side and further applying heat, the insulating material is bonded to the metal foil (12*c*) and the metal foil (11*a*), and the first insulating layer 21 is formed. As illustrated in FIG. 5Ba in which unevenness of a portion indicated by VBa in FIG. 5B is exaggeratedly illustrated in an enlarged view, the metal foil (11*a*) is laminated on the first insulating layer 21 with the mat surface (unevenness (11*a*G)) of the metal foil (11*a*) facing the first insulating layer 21. The unevenness (11*a*G) and unevenness of other portions described below are illustrated only in exaggerated enlarged views, and are omitted in FIG. 5B and in drawings drawn at the same scale as FIG. 5B.

Figure 5C:
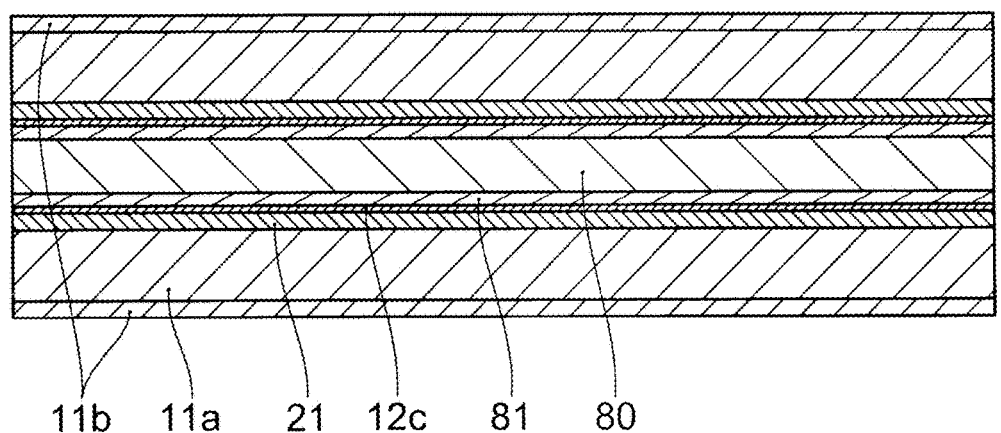
FIG. 5C illustrates a method for manufacturing a printed wiring board according to an embodiment of the present invention.

As illustrated in FIG. 5C, the conductor coating (11*b*) is formed from a plating film on an entire surface of the metal foil (11*a*). The conductor coating (11*b*) is formed from a plating film by electroless plating or by electrolytic plating using the metal foil (11*a*) as a seed layer. The first conductor layer 11 is obtained including the metal foil (11*a*) and the conductor coating (11*b*), the conductor coating (11*b*) being formed from a plating film. For example, when the metal foil (11*a*) is thinner than a desired thickness of the first conductor layer 11, the conductor coating (11*b*) such as a plating film is formed as needed. Therefore, in manufacturing the printed wiring board of the embodiment, the conductor coating (11*b*) formed from a plating film is not necessarily required to be formed. It is also possible that a conductor coating different from a plating film is formed on a surface of the metal foil (11*a*) by sputtering or using a vapor deposition method.

Figure 5D:
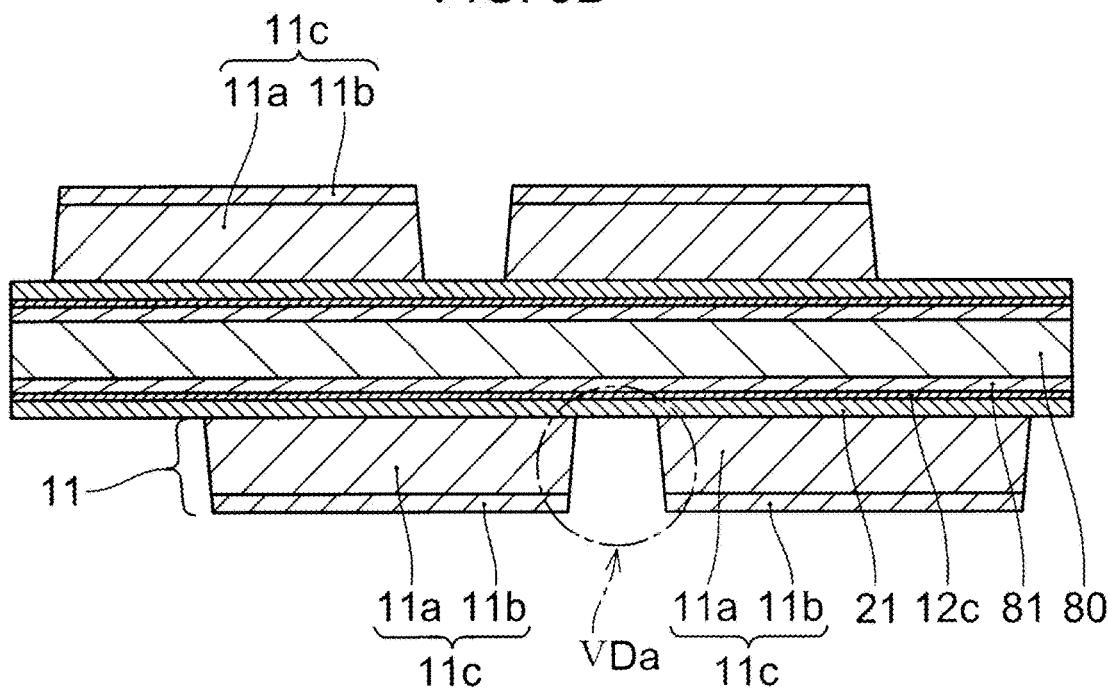
FIG. 5D illustrates a method for manufacturing a printed wiring board according to an embodiment of the present invention.
Figure 5D:
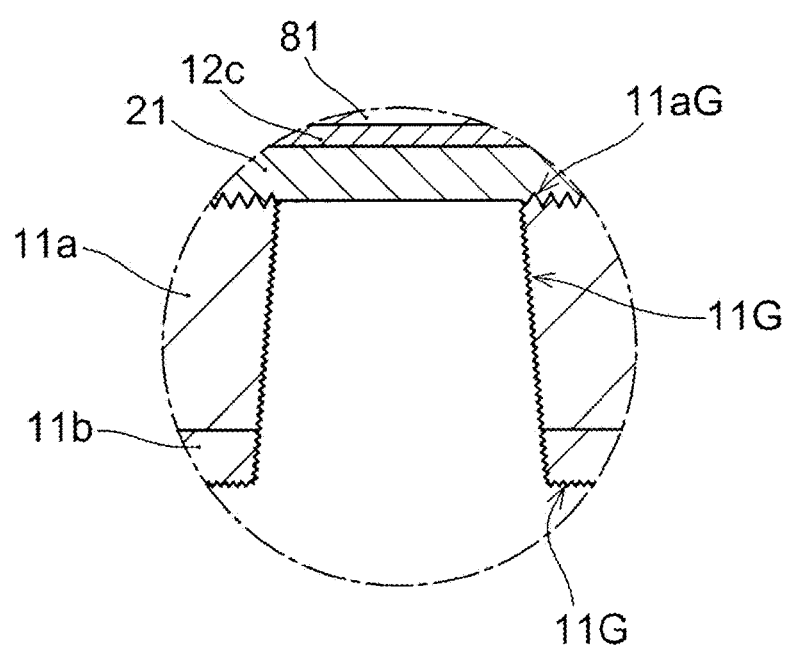

As illustrated in FIG. 5D, the first conductor layer 11 is patterned to have desired conductor patterns. For example, an etching mask having openings corresponding to the desired conductor patterns of the first conductor layer 11 is formed on the first conductor layer 11. Then, by removing portions exposed in the openings by etching, the first conductor layer 11 is patterned. As a result, the first conductor layer 11 is separated into individual conductor patterns such as the inner-layer conductor pads (11*c*) and the inner-layer wiring patterns (11*d*) (see FIG. 1). As illustrated in FIG. 5D, the portions removed by etching can each have a tapered shape tapering toward the first insulating layer 21 side depending on characteristics of an etching solution and etching conditions. However, it is also possible that the portions are substantially vertically etched by dry etching, sandblasting or the like. The etching is performed over a period of time depending on the thickness of the first conductor layer 11. It is also possible that the etching of the first conductor layer 11 is divided to be performed in multiple times.

Figure 5E:
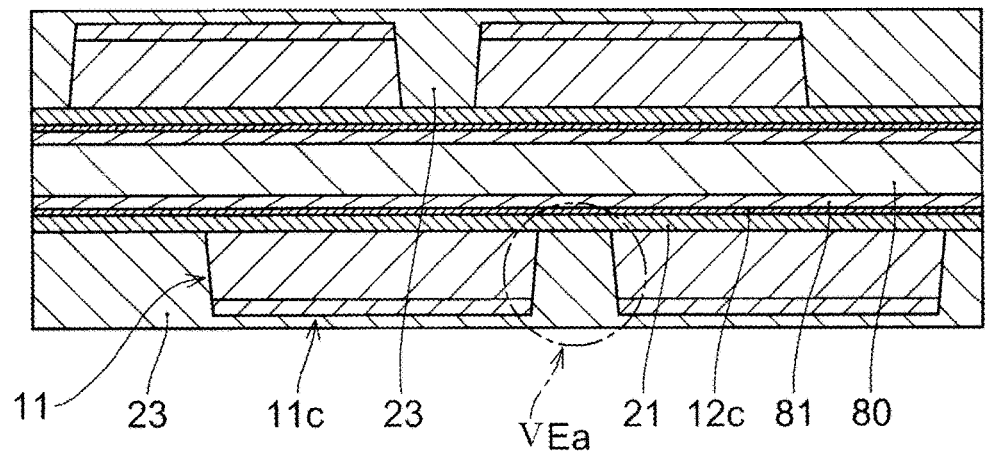
FIG. 5E illustrates a method for manufacturing a printed wiring board according to an embodiment of the present invention.
Figure 5E:
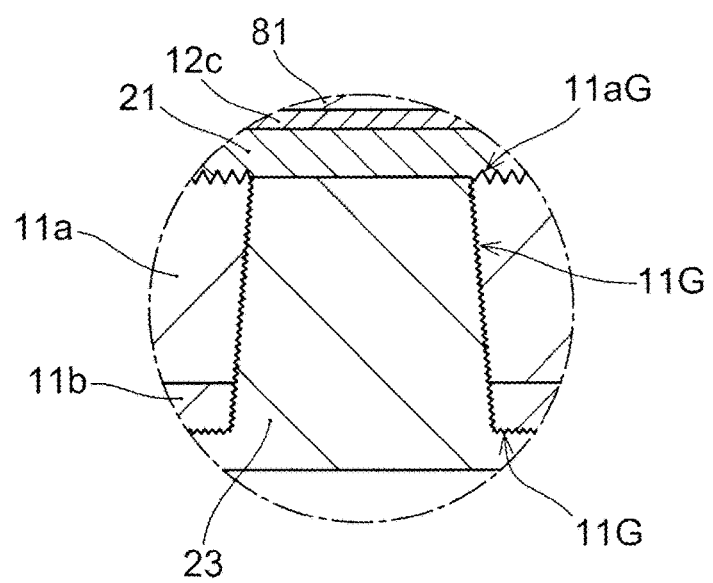

After the first conductor layer 11 is patterned, preferably, exposed surfaces of the first conductor layer 11 including side surfaces of the conductor patterns of the first conductor layer 11 are subjected to a roughening treatment. As a result, as illustrated in FIGS. 5Da and 5Ea in which unevenness of portions respectively indicated by VDa and VEa in FIG. 5D and 5E is exaggeratedly illustrated in enlarged views, unevenness (11G) is formed on the exposed surfaces of the first conductor layer 11. The unevenness (11G) is smaller than the unevenness (11*a*G) of the mat surface of the metal foil (11*a*). These enlarged views are drawn for a purpose of illustrating an effect of the roughening treatment, and unevenness remaining in the first insulating layer 21 is not illustrated. The same applies to FIG. 5Fa and 5Ga to be described below. Examples of the roughening treatment include a blackening treatment by immersion in a strong alkaline solution and microetching by immersion in an organic acid-based etching agent. It is thought that, due to the roughening treatment, adhesion between the intralayer insulator 23 (see FIG. 5E) (described later) and the first conductor layer 11 is improved.

As illustrated in FIG. 5E, the intralayer insulator 23 is formed in the portions removed by etching between the conductor patterns (11*c*) of the first conductor layer 11. For example, an epoxy resin is printed on the first conductor layer 11. The intralayer insulator 23 is formed by a part of the printed epoxy resin entering between the conductor patterns (11*c*). When necessary, the epoxy resin is cured by heating or the like. As described above, the intralayer insulator 23 may also be formed using any insulating material other than epoxy.

Figure 5F:
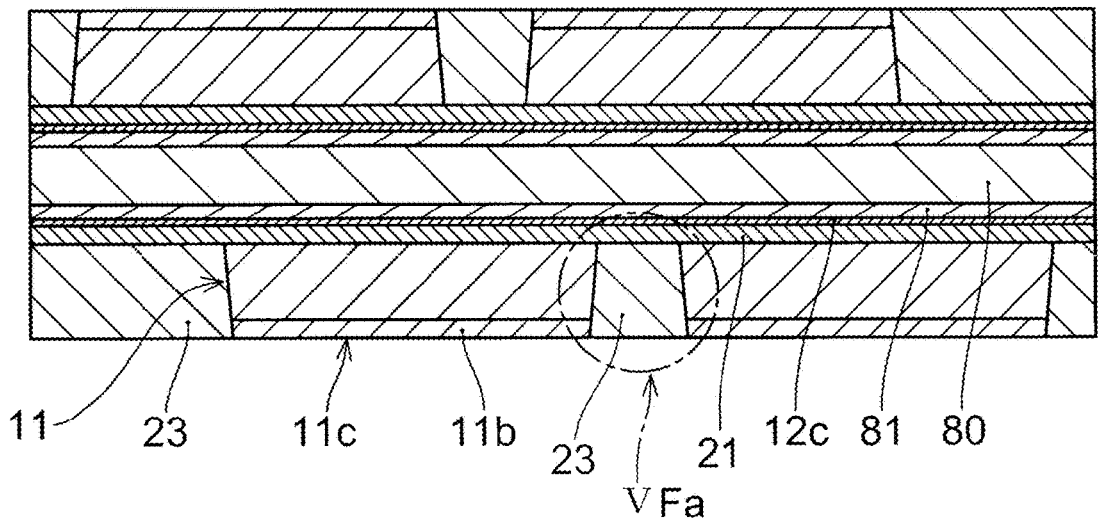
FIG. 5F illustrates a method for manufacturing a printed wiring board according to an embodiment of the present invention.
Figure 5F:
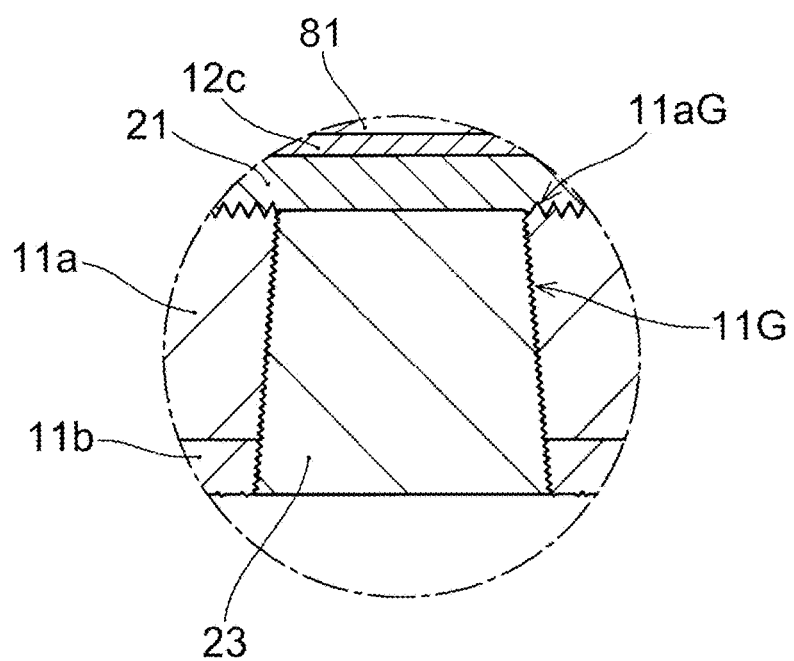

When the material fondling the intralayer insulator 23 is applied by printing or the like, as illustrated in FIG. 5E, the material can be applied not only between the conductor patterns (11*c*) of the first conductor layer 11, but also on surfaces of the conductor patterns (11*c*) on an opposite side of the first insulating layer 21. In this case, as illustrated in FIG. 5F, the material that fauns the intralayer insulator 23 and is applied on the conductor patterns (11*c*) of the first conductor layer 11 is removed by CMP (chemical mechanical polishing) or the like until the surfaces of the conductor patterns (11*c*) of the first conductor layer 11 are exposed. The surfaces of the conductor patterns (11*c*) of the first conductor layer 11 are exposed, and these surfaces and the surface of the intralayer insulator 23 on an opposite side of the first insulating layer 21 are substantially flush with each other.

Figure 5G:
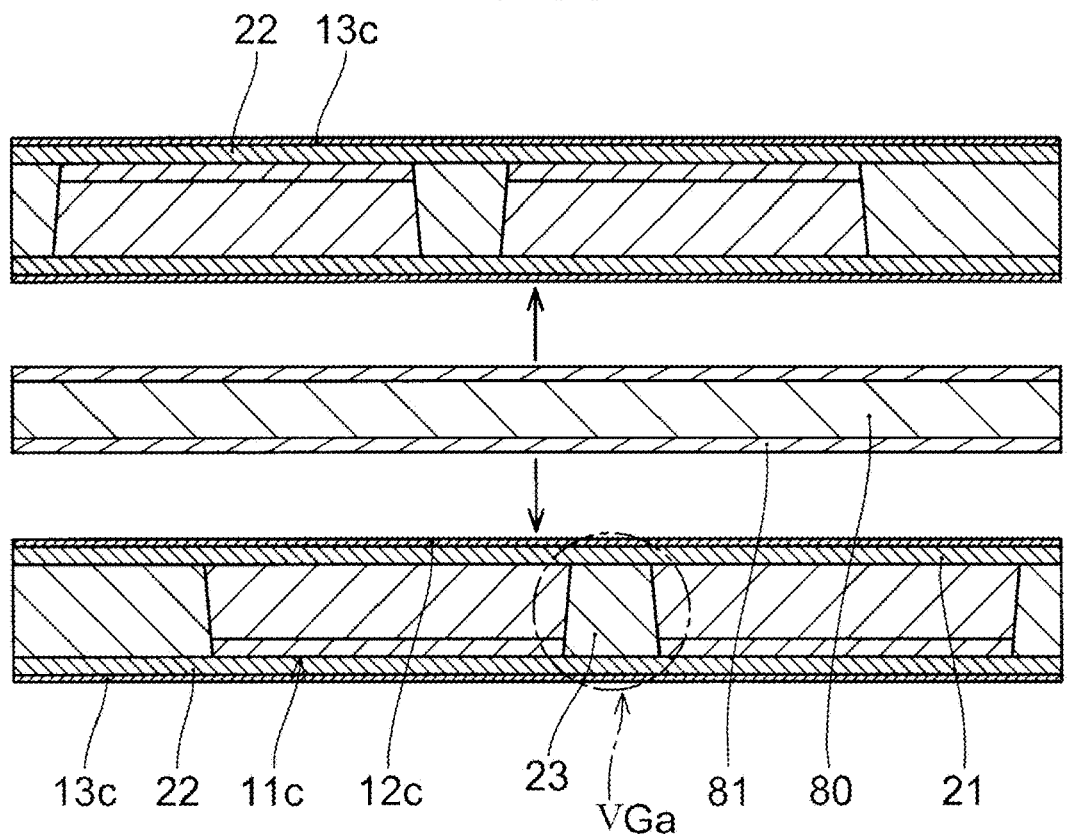
FIG. 5G illustrates a method for manufacturing a printed wiring board according to an embodiment of the present invention.
Figure 5G:
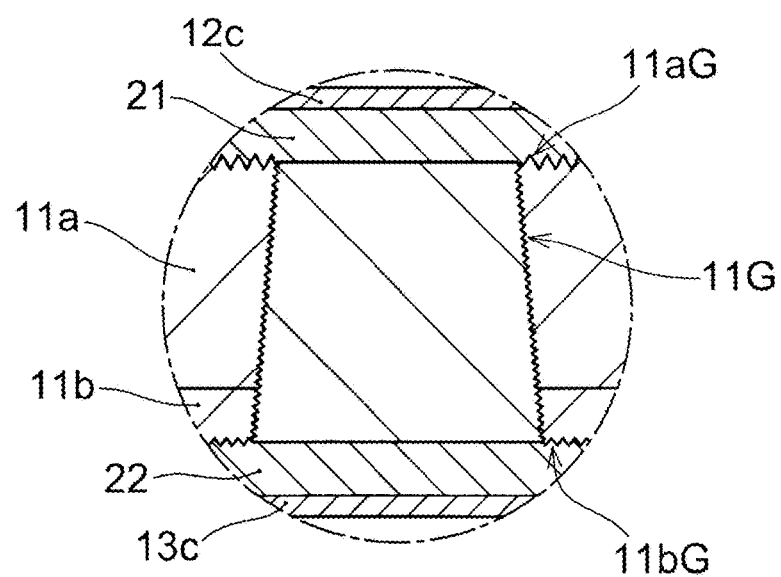

Thereafter, preferably, the exposed surface of the first conductor layer 11 is roughened by a blackening treatment or by microetching. As described above, the surface of the first conductor layer 11 on an opposite side of the metal foil (11*a*) is preferably roughened after the patterning process of the first conductor layer 11. However, since the state of the surface can be changed by the above-described polishing process, the exposed surface of the conductor coating (11b) of the first conductor layer 11 is preferably roughened again. That is, as illustrated in FIG. 5Fa in which unevenness of a portion indicated by VFa in FIG. 5F before a blackening treatment is exaggeratedly illustrated in an enlarged view, due to polishing, the unevenness (11G) of the surface of the conductor coating (11b) of the first conductor layer 11 has almost disappeared and only slightly remains. Further, after the blackening treatment, as illustrated in FIG. 5Ga in which unevenness of a portion indicated by VGa in FIG. 5G is exaggeratedly illustrated in an enlarged view, unevenness (11bG) is fanned on the exposed surface of the conductor coating (11b). In the above-described polishing process, unevenness may slightly remain, and in that case, the remaining unevenness can be roughened again. Therefore, the unevenness (11bG) may be slightly larger than the unevenness (11G) of the first conductor layer 11. It is thought that, due to the roughening treatment, adhesion between the second insulating layer 22 (see FIG. 5G) (described later) and the first conductor layer 11 is improved.

As illustrated in FIG. 5G, an insulating material that forms the second insulating layer 22 is laminated on the exposed surfaces of the first conductor layer 11 and the intralayer insulator 23, and a metal foil (13c) that forms the third conductor layer 13 (see FIG. 3) is further laminated on the insulating material. By applying pressure from the metal foil (13c) side and further applying heat, the insulating material is bonded to the first conductor layer 11, the intralayer insulator 23 and the metal foil (13c), and the second insulating layer 22 is formed. The insulating material that fauns the second insulating layer 22 is, for example, an epoxy resin or a prepreg foil ied into a film-like shape, and is preferably the same as the above-described insulating material that forms the first insulating layer 21. The metal foil (13c) is an arbitrary metal foil such as copper foil or nickel foil. Preferably, a metal foil that is formed of the same material and has substantially the same thickness as the metal foil (12c) is used for the metal foil (13c).

After the formation of the second insulating layer 22, the carrier metal foil 81 and the metal foil (12c) are separated from each other. As a result, the printed wiring board during manufacture is separated from the support plate 80. For example, a thermoplastic adhesive that bonds the metal foil (12c) and the carrier metal foil 81 to each other is softened by heating, and, in this state, the metal foil (12c) and the carrier metal foil 81 are pulled apart. When the metal foil (12c) and the carrier metal foil 81 are adhered to each other only in an outer peripheral portion, the metal foil (12c) and the carrier metal foil 81 may be cut at an inner peripheral side of the adhering portion so that the adhering portion is removed.

Figure 5H:
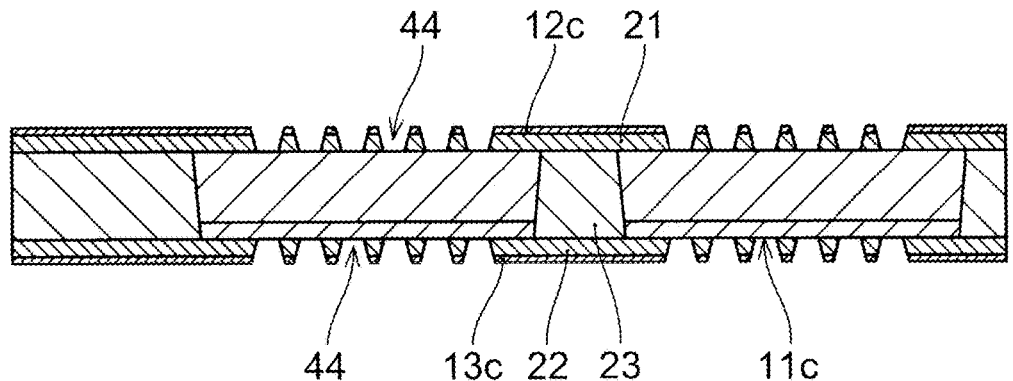
FIG. 5H illustrates a method for manufacturing a printed wiring board according to an embodiment of the present invention.

As illustrated in FIG. 5H, via holes 44 penetrating the metal foil (12c) and the first insulating layer 21, or the metal foil (13c) and the second insulating layer 22 are formed at formation locations of the first and second via conductors 41, 42 (see FIG. 3) and the third via conductors 43 (see FIG. 1). The formation locations of the first via conductors 41 also extend to an outer side of the electronic component (E1) relative to the component mounting region (R) (see FIG. 1). Therefore, a large number of via holes 44 are formed on an outer side of a portion where the electronic component (E1) is connected. Similarly to the first via conductors 41, the second via conductors 42 are also preferably formed in a region extending to an outer side of the component mounting region (R). Therefore, preferably, a large number of via holes 44 are formed on an outer side of a projection position of the component mounting region (R) of the second insulating layer 22. Although not illustrated in FIG. 5H, via holes are similarly farmed at formation locations of the third via conductors 43 (see FIG. 1). For the formation of the via holes 44, for example, CO2 laser is irradiated to predetermined positions on the metal foil (12c) and on the metal foil (13c). Bt irradiating laser to the metal foil (12c) and the metal foil (13c) from opposite sides of the first conductor layer 11, the via holes 44 each having a tapered shape that is reduced in diameter toward the first conductor layer 11 are formed in the insulating layers (21, 22) on both sides of the first conductor layer 11.

Figure 5I:
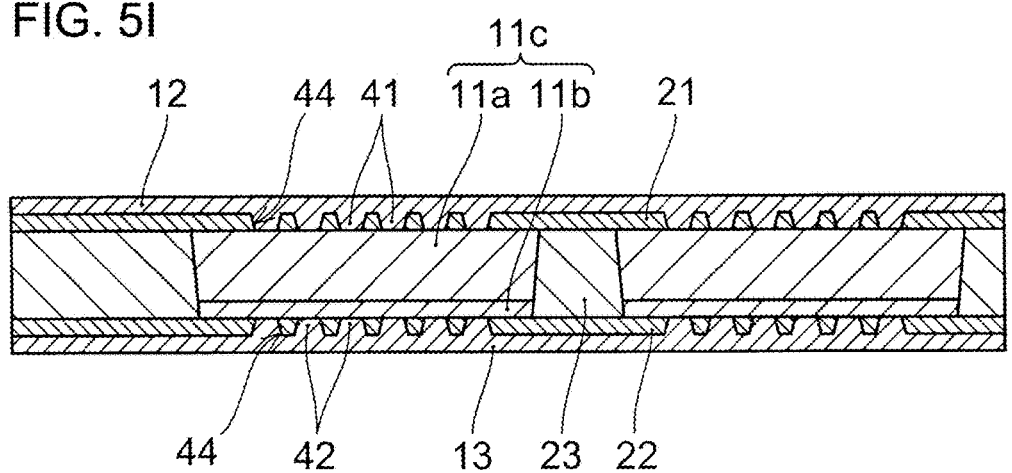
FIG. 5I illustrates a method for manufacturing a printed wiring board according to an embodiment of the present invention.

Subsequently, a metal film (not illustrated in the drawings) is formed on in the via holes 44 and on the surfaces of the metal foils (12c, 13c) by electroless plating or sputtering or the like. Then, electrolytic plating is performed using the metal film as a seed layer, and an electrolytic plating film is formed in the via holes 44 and on the metal foils (12c, 13c). The electrolytic plating is performed with an appropriate plating time according to hole diameters, depths and the number of the via holes 44. It is also possible that the electrolytic plating process is performed in multiple times depending on characteristics of a plating solution and plating conditions. As a result, as illustrated in FIG. 5I, the first-third via conductors (41-43) are formed in the via holes 44; the second conductor layer 12 is formed on the first insulating layer 21; and the third conductor layer 13 is formed on the second insulating layer 22. The second and third conductor layers (12, 13) can each be formed from the metal foil (12c) or the metal foil (13c) (see FIG. 5H), a metal film fruited by electroless plating or the like, and an electrolytic plating film formed using the metal film as a seed layer. However, in FIG. 5I and in FIG. 5J to be described later, the second and third conductor layers (12, 13) are each illustrated with a single-layer structure for convenience.

As described above, a large number of the via holes 44 are also formed on an outer side of the component mounting region (R) (see FIG. 1). Therefore, a large number of the first via conductors 41 are also formed on an outer side of the component mounting region (R). Similarly, the second via conductors 42 are preferably formed also on an outer side of the component mounting region (R). After the formation of the second and third conductor layers (12, 13), preferably, in order to flatten the surface, the second and third conductor layers (12, 13) are soft etched using a chemical solution composed of hydrogen peroxide, sulfuric acid or the like.

Figure 5J:
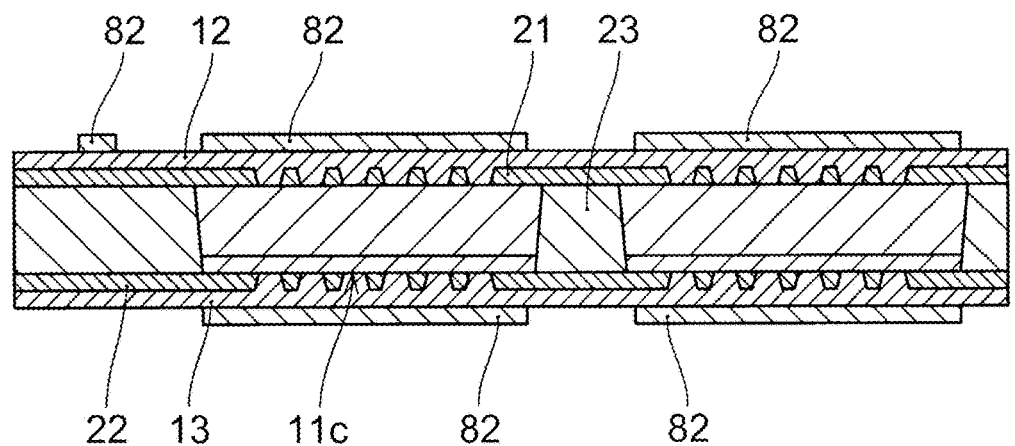
FIG. 5J illustrates a method for manufacturing a printed wiring board according to an embodiment of the present invention.

Thereafter, the second and third conductor layers (12, 13) are patterned into desired conductor patterns. That is, the conductor patterns of the second and third conductor layers (12, 13) such as the component mounting pads (12a) and the connection conductor pads (13a) (see FIG. 3) are formed. As illustrated in FIG. 5J, an etching resist film 82 is formed covering regions where conductor patterns of the second and third conductor layers (12, 13) are fonned. The formation regions of the component mounting pads (12a) and the formation regions of the connection conductor pads (13a) and the like are masked by the etching resist film 82. Then, portions of the second and third conductor layers (12, 13) that are exposed without being covered by the etching resist film 82 are removed by etching. As a result, the second and third conductor layers (12, 13) are patterned to have the desired conductor patterns. That is, the component mounting pads (12a) are formed so as to cover the formation regions of the first via conductors 41, and the connection conductor pads (13a) are formed so as to cover the formation regions of the second via conductors 42. As a result, the component mounting pads (12a) and the connection conductor pads (13a) are formed extending to an outer side of the component mounting region (R). Through these processes, the printed wiring board 1 illustrated in FIG. 1-3 is completed.

As described above, the solder resist layer 31 (see FIG. 3) may be formed in the printed wiring board 1. The solder resist layer 31 can be formed, for example, by applying a photosensitive epoxy resin or the like to substantially the entire first surface (1F) and second surface (1S) by printing or spraying or the like. Then, in the solder resist layer 31, openings 32 exposing connecting portions (soldering portions) such as the component mounting pads (12a) and the connection conductor pads (13a) are provided using a photolithography technology. Further, on the surfaces of the component mounting pads (12a) and the connection conductor pads (13a) exposed from the openings 32 of the solder resist layer 31, a surface protection film may be formed as needed by electroless plating of nickel, palladium, gold or the like.

Further, in a case where a printed wiring board is manufactured having two or more insulating layers and two or more conductor layers on each of both sides of the thick inner-layer first conductor layer 11, for example, after the patterning of the conductor layers (12, 13) on both sides illustrated in FIG. 5J, an insulating material that forms an upper-layer insulating layer and a metal foil are further laminated. Then, processes same as the processes illustrated in FIG. 5H-5J are repeated. Any number of insulating layers, conductor layers and via conductors (thermal vias) can be formed on each of both sides of the thick inner-layer first conductor layer 11.

It is also possible that the second and third conductor layers (12, 13) having the desired conductor patterns are formed using a so-called semi-additive method different from the subtractive method illustrated in FIGS. 5I and 5J. Further, it is also possible that the first conductor layer 11 is not patterned after the lamination of the metal foil (11a) as illustrated in FIG. 5B-5D. For example, it is also possible that the first conductor layer 11 is patterned in advance to have the desired conductor patterns by etching or sandblasting, and thereafter, laminated on the first insulating layer 21. The method for manufacturing the printed wiring board of the embodiment is not limited the method described with reference to FIG. 5A-5J. With respect to the method for manufacturing the printed wiring board of the embodiment, it is possible that a process other than the processes described above is added, and it is also possible that some of the processes described above are omitted.

Japanese Patent Laid-Open Publication No. 2011-138838 describes a circuit substrate that includes a substrate, a frame and a circuit board, which are sequentially laminated, and a conductive member accommodated in the frame. An electronic component is mounted on the circuit board. Heat generated from the electronic component is mainly dissipated to the outside via the circuit board, the conductive member and the substrate.

In the circuit substrate of Japanese Patent Laid-Open Publication No. 2011-138838, the heat generated from the electronic component is conducted through the circuit board toward the conductive member. Further, the heat conducted to the conductive member conducts through the substrate and is dissipated to the outside (for example, a motherboard or the like on which the circuit board is arranged). The circuit board and the substrate are formed of an insulating material such as alumina having a low thermal conductivity as compared to a metal such as copper. Further, as the conductive member, various metals such as aluminum, copper, silver or a composite material thereof can be used, and the metal is laminated in a layered shape and is accommodated in a space of the frame. However, it is believed that it is a difficult task to accommodate the conductive member in the space without gaps. Further, the conductive member and the circuit board and the substrate are merely in contact with each other. Therefore, it is thought that gaps are likely to occur at interfaces due to thermal contraction and the like. Therefore, it is thought that, in the structure described in Japanese Patent Laid-Open Publication No. 2011-138838, it is difficult to obtain sufficient heat dissipation characteristics.

A printed wiring board according to an embodiment of the present invention includes: a first conductor layer as an inner layer; a second conductor layer and a third conductor layer that are respectively formed on outermost layers on both sides (including one surface and the other surface on an opposite side of the one surface) of the first conductor layer; at least one first insulating layer and at least one second insulating layer that are respectively provided between the first conductor layer and the second conductor layer and between the first conductor layer and the third conductor layer; multiple first via conductors that are formed in the first insulating layer and connect the first conductor layer and the second conductor layer; and multiple second via conductors that are formed in the second insulating layer and connect the first conductor layer and the third conductor layer. The first conductor layer is formed thicker than the second conductor layer and the third conductor layer. In the second conductor layer, component mounting pads are formed extending to an outer side an electronic component to be mounted more than a component mounting region does, the component mounting region being a projection region of the electronic component to the second conductor layer. The multiple first via conductors include multiple first via conductors that are formed directly below the component mounting region of the component mounting pads and multiple first via conductors that are formed on an outer side of the component mounting region of the component mounting pads.

According to an embodiment of the present invention, the mounting pads for mounting an electronic component are widely formed extending to an outer side of the component mounting region of the electronic component, and the first via conductors connecting between the first conductor layer and the second conductor layer are also formed on an outer side of a connection region. Therefore, heat generated by the electronic component easily conducts to the component mounting pads having large areas and further easily conducts to the thick first conductor layer via a large number of the first via conductors. As a result, it is thought that heat is dissipated by dissipating heat with the first conductor layer and by conducting heat to the connection conductor pads of the third conductor layer via the second via conductors. It is thought that heat is also dissipated from the connection conductor pads to a motherboard or the like connected to the connection conductor pads.

Obviously, numerous modifications and variations of the present invention are possible in light of the above teachings. It is therefore to be understood that within the scope of the appended claims, the invention may be practiced otherwise than as specifically described herein.

The invention claimed is:
1. A printed wiring board, comprising:
a first conductor layer forming an inner conductor layer;
a second conductor layer forming a first outermost conductor layer on a first side of the first conductor layer;

a third conductor layer forming a second outermost conductor layer on a second side of the first conductor layer on an opposite side with respect to the first side of the first conductor layer;

a plurality of insulating layers including a first insulating layer formed between the first conductor layer and the second conductor layer and a second insulating layer formed between the first conductor layer and the third conductor layer;

a plurality of first via conductors formed in the first insulating layer such that the plurality of first via conductors is connecting the first conductor layer and the second conductor layer; and a plurality of second via conductors formed in the second insulating layer such that the plurality of second via conductors is connecting the first conductor layer and the third conductor layer, wherein the first conductor layer is formed such that the first conductor layer has a thickness that is greater than a thickness of the second conductor layer and greater than a thickness of the third conductor layer, the second conductor layer includes a plurality of component mounting pads positioned to mount an electronic component on the second conductor layer and formed such that each of the component mounting pads is extending outside a component mounting region corresponding to a projection region of the electronic component, and the plurality of first via conductors includes a first set of the first via conductors connected to the component mounting pads and formed directly underneath the component mounting region and a second set of the first via conductors connected to the component mounting pads and formed on an outer side of the component mounting region.

2. A printed wiring board according to claim 1, wherein the plurality of component mounting pads in the second conductor layer comprises a pair of conductor pads formed such that the pair of conductor pads connects to different electrodes of the electronic component.

3. A printed wiring board according to claim 1, wherein the third conductor layer includes a plurality of connection conductor pads formed such that the plurality of connection conductor pads is extending outside a projection region of the component mounting region on the third conductor layer, and the plurality of second via conductors includes a set of the second via conductors formed on an outer side of the projection region of the component mounting region on the third conductor layer.

4. A printed wiring board according to claim 3, wherein the plurality of connection conductor pads in the third conductor layer comprises a pair of conductor pads formed such that the pair of conductor pads forming the connection conductor pads connects to the different electrodes of the electronic component.

5. A printed wiring board according to claim 1, wherein the first conductor layer includes a wiring pattern.

6. A printed wiring board according to claim 1, wherein the first conductor layer comprises a metal foil and a conductor coating layer formed on a surface of the metal foil.

7. A printed wiring board according to claim 6, wherein the first conductor layer is formed such that the metal foil has a mat surface on which the second conductor layer is formed.

8. A printed wiring board according to claim 6, wherein the conductor coating layer of the first conductor layer comprises a plated film.

9. A printed wiring board according to claim 1, further comprising:

a solder resist layer formed such that the solder resist layer is formed to surround the component mounting region.

10. A printed wiring board according to claim 9, wherein the plurality of first via conductors includes a set of the first via conductors formed directly underneath the solder resist layer.

11. A printed wiring board according to claim 2, wherein the first conductor layer includes a wiring pattern.

12. A printed wiring board according to claim 2, wherein the first conductor layer comprises a metal foil and a conductor coating layer formed on a surface of the metal foil.

13. A printed wiring board according to claim 12, wherein the first conductor layer is formed such that the metal foil has a mat surface on which the second conductor layer is formed.

14. A printed wiring board according to claim 12, wherein the conductor coating layer of the first conductor layer comprises a plated film.

15. A printed wiring board according to claim 2, further comprising:

a solder resist layer formed such that the solder resist layer is formed to surround the component mounting region.

16. A printed wiring board according to claim 15, wherein the plurality of first via conductors includes a set of the first via conductors formed directly underneath the solder resist layer.

17. A printed wiring board according to claim 2, wherein the third conductor layer includes a plurality of connection conductor pads formed such that the plurality of connection conductor pads is extending outside a projection region of the component mounting region on the third conductor layer, and the plurality of second via conductors includes a set of the second via conductors formed on an outer side of the projection region of the component mounting region on the third conductor layer.

18. A printed wiring board according to claim 17, wherein the plurality of connection conductor pads in the third conductor layer comprises a pair of conductor pads formed such that the pair of conductor pads forming the connection conductor pads connects to the different electrodes of the electronic component.

19. A printed wiring board according to claim 17, wherein the first conductor layer comprises a metal foil and a conductor coating layer formed on a surface of the metal foil.

20. A printed wiring board according to claim 19, wherein the first conductor layer is formed such that the metal foil has a mat surface on which the second conductor layer is formed.

* * * * *